US011217735B2

(12) United States Patent
Liu et al.

(10) Patent No.: US 11,217,735 B2
(45) Date of Patent: Jan. 4, 2022

(54) LED PACKAGE WITH SURFACE TEXTURES AND METHODS OF FORMATION

(71) Applicant: Luminus Inc., Sunnyvale, CA (US)

(72) Inventors: Saijin Liu, San Jose, CA (US); Hongtao Ma, Campbell, CA (US); Tao Tong, Fremont, CA (US)

(73) Assignee: Luminus, Inc., Sunnyvale, CA (US)

(*) Notice: Subject to any disclaimer, the term of this patent is extended or adjusted under 35 U.S.C. 154(b) by 0 days.

(21) Appl. No.: 14/627,993

(22) Filed: Feb. 20, 2015

(65) Prior Publication Data

US 2016/0247984 A1 Aug. 25, 2016

(51) Int. Cl.

| | |
|---|---|
| ***H01L 33/58*** | (2010.01) |
| ***H01L 33/50*** | (2010.01) |
| ***H01L 33/54*** | (2010.01) |
| ***H01L 33/56*** | (2010.01) |
| ***H01L 33/62*** | (2010.01) |
| *H01L 33/48* | (2010.01) |
| *H01L 25/075* | (2006.01) |

(52) U.S. Cl.

CPC ............ *H01L 33/58* (2013.01); *H01L 33/505* (2013.01); *H01L 33/507* (2013.01); *H01L 33/54* (2013.01); *H01L 33/56* (2013.01); *H01L 33/62* (2013.01); *H01L 25/0753* (2013.01); *H01L 33/486* (2013.01); *H01L 2224/48137* (2013.01); *H01L 2224/48257* (2013.01); *H01L 2924/181* (2013.01); *H01L 2933/005* (2013.01); *H01L 2933/0041* (2013.01); *H01L 2933/0058* (2013.01); *H01L 2933/0066* (2013.01)

(58) Field of Classification Search

CPC ..... H01L 2924/12041; H01L 2924/181; H01L 33/56; H01L 2933/0091; H01L 33/22; H01L 33/2256; H05K 2201/10106; Y10S 362/80; G02F 1/133603

USPC ...................... 257/80–82, 99, 100, 414, 433; 438/24–29, 48, 64

See application file for complete search history.

(56) References Cited

U.S. PATENT DOCUMENTS 8,525,202 B2 * 9/2013 Watari .................... H01L 24/97 257/100

8,956,922 B2 * 2/2015 Pell .......................... F21K 9/00 438/127

(Continued)

*Primary Examiner* — Hsien Ming Lee

(74) *Attorney, Agent, or Firm* — Wolf, Greenfield & Sacks, P.C.

(57) ABSTRACT

Methods and apparatus are provided for LED packages with surface textures. In one novel aspect, microstructures are formed on surfaces of the LED package such that light extract efficiency is improved. In one embodiment, the LED package has a silicone-encapsulating layer scattered with phosphors. In another embodiment, the LED package has a leadframe substrate. The microstructure can be micro lens, micro dents, micro pillars, micro cones, or other shapes. The microstructures can be periodically arranged or randomly arranged. In one novel aspect, the compression molding process is used to form rough surfaces. The molding block or the release film is modified with microstructures. In another novel aspect, sandblasting process is used. In one embodiment, microstructures are formed on sidewalls using the sandblasting process. The hardness, the angle, and/or the size of the blasting media are selected to improve the efficiency of the LED package.

3 Claims, 7 Drawing Sheets

(56) References Cited

U.S. PATENT DOCUMENTS

| | | | | |
|---|---|---|---|---|
| 9,000,466 | B1 * | 4/2015 | Aldaz | H01L 33/58 257/94 |
| 2007/0212802 | A1 * | 9/2007 | Lee | H01L 33/54 438/22 |
| 2009/0152573 | A1 * | 6/2009 | Loh | H01L 33/54 257/89 |
| 2010/0186893 | A1 * | 7/2010 | Ashton | B29C 35/0227 156/287 |
| 2011/0186893 | A1 * | 8/2011 | Kondo | B29C 43/18 257/98 |
| 2012/0014091 | A1 * | 1/2012 | He | H01L 25/0753 362/97.1 |
| 2016/0056352 | A1 * | 2/2016 | Koike | H01L 33/22 257/98 |

* cited by examiner

LED PACKAGE WITH SURFACE TEXTURES AND METHODS OF FORMATION

TECHNICAL FIELD

The present invention relates generally to light-emitting diodes (LED) package and, more particularly, to LED package with surface textures and methods of formation.

BACKGROUND INFORMATION

Development in light-emitting diode (LED) lighting technology continues to take place at a dramatic pace. With improved brightness, lower energy consumption, and longer life spans, the global market for LED lighting has grown exponentially. The rapid adoption of LED lighting in the commercial and residential markets requires further improvements in LED efficiency and quality. Surface mount technology (SMT) packaging has been widely used due to its small size, low power consumption, and long life spans.

In a SMT LED package, one or more LEDs are mounted on a substrate. A transparent encapsulating layer is added to cover the LEDs and over the substrate. The top surface of the encapsulating layer is normally smooth. In some LED packages, the encapsulating layer also has side surfaces. In the conventional design, the side surfaces of the silicone layer are also very smooth. The LED light has relatively higher chance to be reflected back from the smooth surfaces due to total internal reflection. It, thereby, decreases the efficiency of the SMT LED package.

SUMMARY

Methods and apparatus are provided for LED packages with surface textures. In one novel aspect, microstructures are formed on surfaces of the LED package such that light extract efficiency is improved compared with the smooth-surfaced LED package. In one embodiment, the LED package has a silicone-encapsulating layer and phosphor particles are embedded in the silicone material. In another embodiment, the LED package has a leadframe substrate. In one embodiment, microstructures are formed on the top surface of the LED package. In another embodiment, the side surfaces or sidewalls of the LED package are also formed with microstructures. The microstructures can be micro lenses, micro dents, micro pillars, micro cones, or other shapes. The microstructures can be periodically arranged or randomly arranged.

In one novel aspect, the compression molding process is used to form rough surfaces for the LED package. In one embodiment, a modified molding structure with microstructures, such as the molding block or the release film is used. The microstructures are formed on top of the LED package during the compression molding process. In one embodiment, the microstructures are randomly arranged. In another embodiment, the microstructures are periodically arranged.

In yet another novel aspect, sandblasting process is used to form rough surfaces for the LED package. The blasting media is chosen such that it is harder than the silicone and softer than the phosphor particles. The blasting media size is about a few microns to one hundred microns. The media material could be glass beads or other abrasive media. The sandblasting process can be performed by an automatic sandblasting machine. The LED package could be tilted such that microstructures are formed on sidewalls. In one embodiment, the size of the media is selected based on a size-selection criterion to improve the efficiency of the LED package. In another embodiment, the angle of sandblasting media is selected based on angle-selection criterion to improve the efficiency of the LED package.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

SMT LED package provides many benefits.

Figure 1:
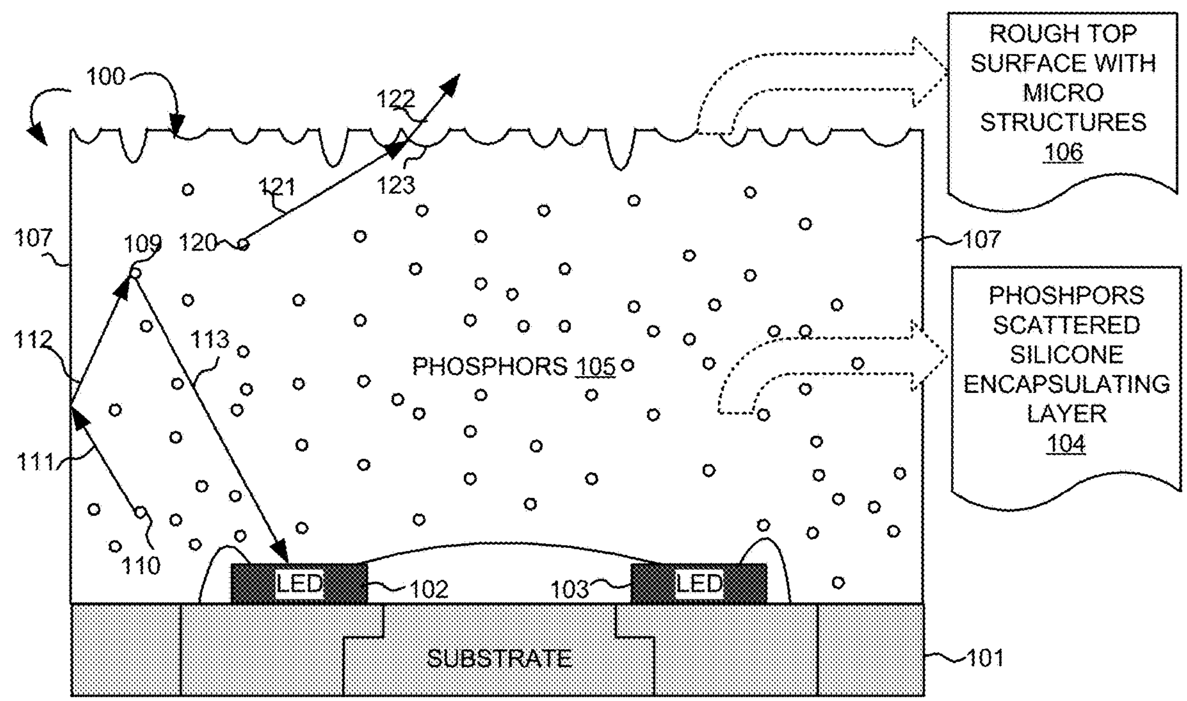
FIG. 1 is a perspective view of an exemplary LED package with rough top surface formed by microstructures in accordance with embodiments of the current invention.

FIG. 1 is a perspective view of an exemplary LED package 100 with rough top surface formed by microstructures in accordance with embodiments of the current invention. LED package 100 has a substrate 100, two LEDs 102 and 103 and a phosphor scattered silicone-encapsulating layer 104. In one embodiment, substrate 100 is a leadframe substrate. In another embodiment as shown in FIG. 1, silicone-encapsulating layer 104 is cube-shaped having a top surface 106 and side surfaces 107. In other embodiments, different encapsulating layer are used, such as dome-shaped encapsulating layer. In one embodiment, silicone-encapsulating layer 104 is scattered with phosphors 105. Phosphors 105 scatter in the entire body of silicone encapsulating layer 104. The efficiency of the LED package is an important measurement of the quality. Although many improvements have been made to make the LED chips to be more efficient, the LED packaging needs to improve more to boost the overall efficiency.

FIG. 1 shows a LED package with smooth sidewalls/side surfaces. The smooth surfaces of LED package 100 reduce the overall efficiency. For example, a phosphor 110 emits a ray 111, which bounced back by side surface 107. Because surface 107 is flat, there is relatively higher chance that rays, as ray 111, will be bounced back to the encapsulating layer 104 due to total internal reflection. The bounced backed ray 112 reflects again when hitting phosphor 109. The reflected ray 113 travels downwards and is absorbed by the surface of LED 102. There are relatively higher percentages of cases as illustrated above. The bounced-back light makes the whole LED package less efficient. Similar efficiency loss occurs if the top surface is smooth.

In one novel aspect, the top surface of LED package is a rough surface formed by microstructures. The rough surface helps the light to escape by reducing chances of the total internal reflection. For example, a phosphor 120 emits a light ray 121. Ray 121 reaches top surface 106. Since top surface 106 is a rough surface, it reduces the chances of the total internal reflection. In the example, ray 121 reaches a microstructure 123 at the top surface. The angle ray 121 intersect with microstructure 123 makes ray 121 escape and travels out as ray 122. The microstructures at top surface 106, thereby, let more light escape the top surface. The overall light extract efficiency of LED package 100 is increased compared with a smooth surfaced LED package.

Figure 2:
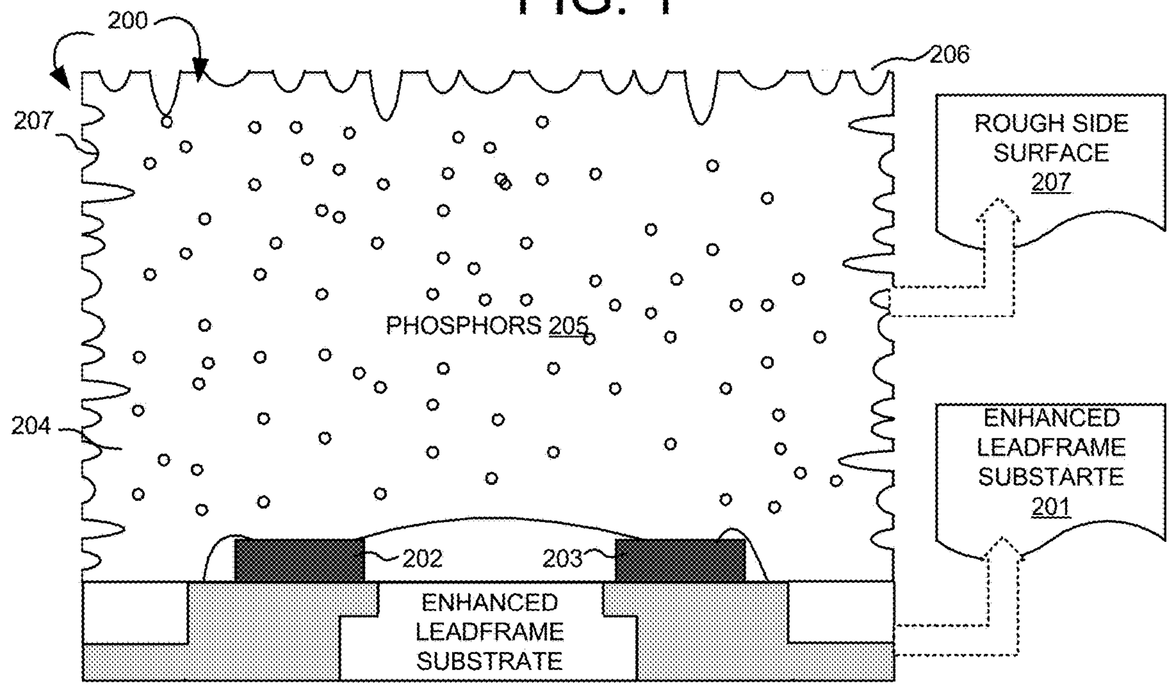
FIG. 2 shows an exemplary LED package with the rough top surface as well as rough side surfaces in accordance with embodiments of the current invention.

In another novel aspect, side surfaces of a LED package are rough surfaces formed by microstructures. FIG. 2 shows an exemplary LED package 200 with the rough top surface as well as rough side surfaces in accordance with embodiments of the current invention. LED package 200 has a substrate 201, two LEDs 202 and 203 and a phosphor scattered silicone-encapsulating layer 204. In one embodiment, substrate 201 is a leadframe substrate. In one embodiment as shown in FIG. 2, silicone-encapsulating layer 204 is cube-shaped having a top surface 206 and side surfaces 207. In one embodiment, silicone-encapsulating layer 204 is scattered with phosphors 205. Phosphors 205 scatter in the entire body of silicone encapsulating layer 204. The rough sidewalls of LED package 200 further enhance the efficiency of the overall performance by allowing more lights to escape from the sidewalls.

LED packages with roughened top surface and roughened side surfaces, reduce chances of total internal reflection, and thereby increase the efficiency. The rough surfaces are formed by microstructures. In one embodiment, the microstructures are randomly arranged. The randomly arranged microstructures can be produced by the compression molding process or the sandblasting process. The microstructures can be of the same shape, different shapes, or random shapes. In another novel aspect, the microstructures can be periodically arranged. The periodically arranged microstructures can be of the same shape or different shapes. With periodically arranged shapes, different patterns can be chosen.

Figure 3:
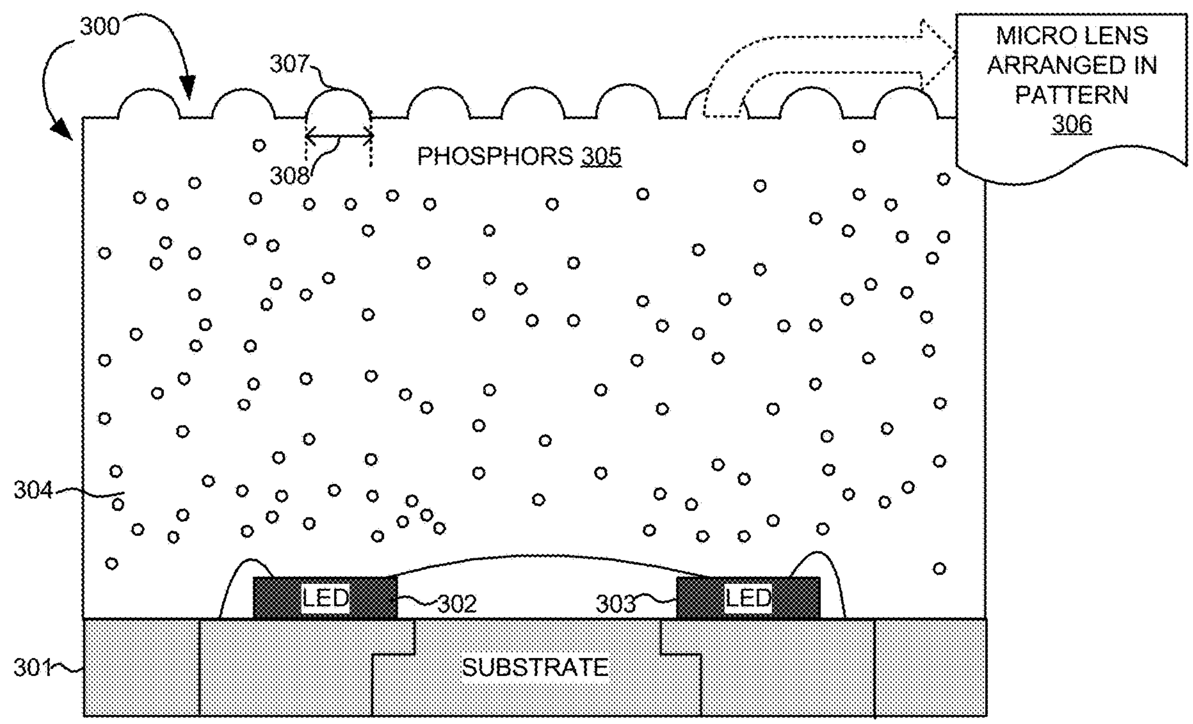
FIG. 3 shows an exemplary LED package 300 with periodically arranged micro lens for the top surface in accordance with embodiments of the current invention.

FIG. 3 shows an exemplary LED package 300 with periodically arranged micro lens for the top surface in accordance with embodiments of the current invention. LED package 300 has a substrate 301, two LEDs 302 and 303 and a phosphor scattered silicone-encapsulating layer 304. The silicone-encapsulating layer 304 is scattered with phosphors 305. A top surface 306 of LED package 300 has a rough surface with periodically arranged micro lens. For example, top surface 306 has a micro lens 307 with a diameter of 308. In one embodiment, diameter 308 is about 2 μm to 20 μm. Multiple micro lenses with the same diameter as micro lens 307 are periodically arranged at top surface 306. Multiple micro lenses form the rough top surface, reduce the chances of total internal reflection and thereby, improve the efficiency of LED package 300 compared with smooth-faced LED packages. Other types of periodically arranged microstructures, such as micro dents, micro pillars, and micro cones can be used to form the rough top surface. The periodically arranged microstructures can form different patterns. The rough surface is formed with a predefined microstructure size, microstructure shape, and arrangement. Different combinations of these variables can be used as sample packages. Efficiency measurement can be performed using these sample packages. The efficiencies, thereby, can be further improved based on the obtained measurements.

Figure 4:
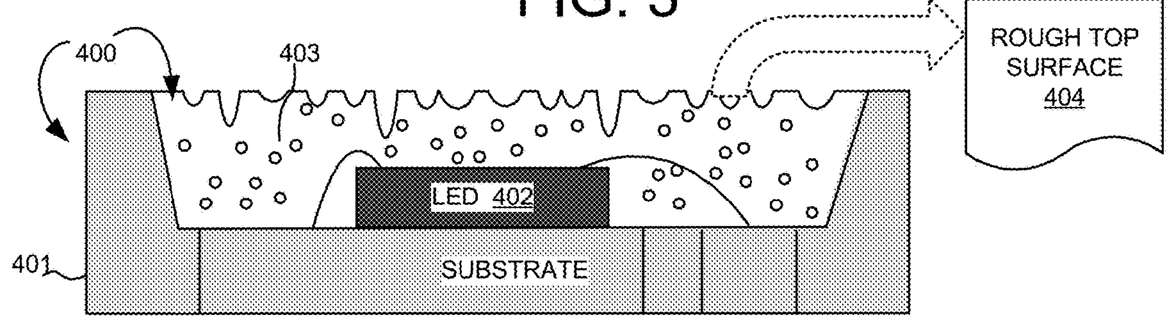
FIG. 4 is an exemplary diagram of a flat middle-power LED package with a rough top surface formed by randomized microstructures in accordance with embodiments of the current invention.
Figure 5:
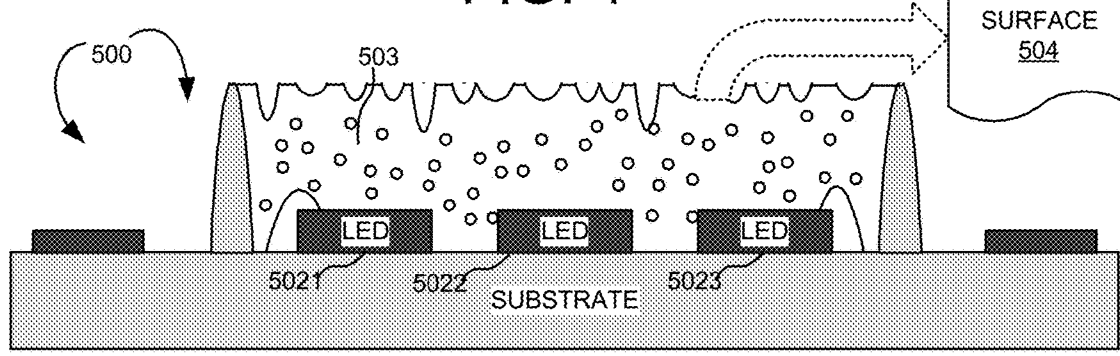
FIG. 5 is an exemplary diagram of a COB LED package with a rough top surface formed by randomized microstructures in accordance with embodiments of the current invention.

Rough surfaces for LED packages can improve the light extract efficiency by about 5%. The microstructures can be employed into other types of LED packages, such as flat middle-power packages and chip on board (COB) packages. Most of the COB packages and the flat middle-power packages do not have sidewalls. Examples of middle-power packages include Luminus MP-3030 or MP-2016, Nichia NF2L757, LumiLEDs LUXEON 3030, etc. The middle-power packages are based on EMC (Epoxy molding compound) or SMC (silicone molding compound) substrate technology. These packages are initially built with smooth top surfaces. In one embodiment, the sandblasting process is used to form the rough top surface for a COB or a flat middle-power LED package. The rough surface is formed by randomized arranged microstructures. FIG. 4 and FIG. 5 show exemplary LED packages with rough top surfaces formed by randomized microstructures.

FIG. 4 is an exemplary diagram of a flat middle-power LED package 400 with a rough top surface formed by randomized microstructures in accordance with embodiments of the current invention. LED package 400 has a substrate 401, an LED 402, and an encapsulating layer 403 scattered with phosphors. Regular flat middle-power LED package has a smooth top surface. In one embodiment, applying the sandblasting process to a smoothed surfaced LED package built in a conventional way, a rough surface 404 is formed with randomly arranged microstructures. The overall light extract efficiency of flat middle-power LED package 400 is increased compared with the conventional smooth surfaced LED package.

FIG. 5 is an exemplary diagram of a COB LED package 500 with a rough top surface formed by randomized microstructures in accordance with embodiments of the current invention. LED package 500 has multiple LEDs such as 5021, 5022, and 5023, and an encapsulating layer 503 scattered with phosphors. Regular COB LED package has a smooth top surface. In one embodiment, applying the sandblasting process to a smooth surfaced COB LED package built in the conventional way, a rough surface 504 is formed with randomly arranged microstructures. The overall light extract efficiency of COB LED package 500 is increased compared with the conventional smooth surfaced COB LED package.

Microstructures on the top surface of the LED package can improve light extract efficiency. In other embodiments, microstructures are formed on the top surface and side surfaces of the LED package such that the total internal reflection is reduced, and the overall light extract efficiency is increased. These microstructures can be randomly arranged or periodically arranged. Different process can be used to form rough surfaces for the LED packages. In one embodiment, the compression molding process is used. The compression molding process can be used to form rough top surface. The rough top surface formed by compression molding can be either randomly arranged or periodically arranged. In another embodiment, the sandblasting process is used. The sandblasting process is mostly used to form randomly arranged microstructures. The sandblasting process can be used to form rough top surface as well as rough side surfaces.

Figure 6:
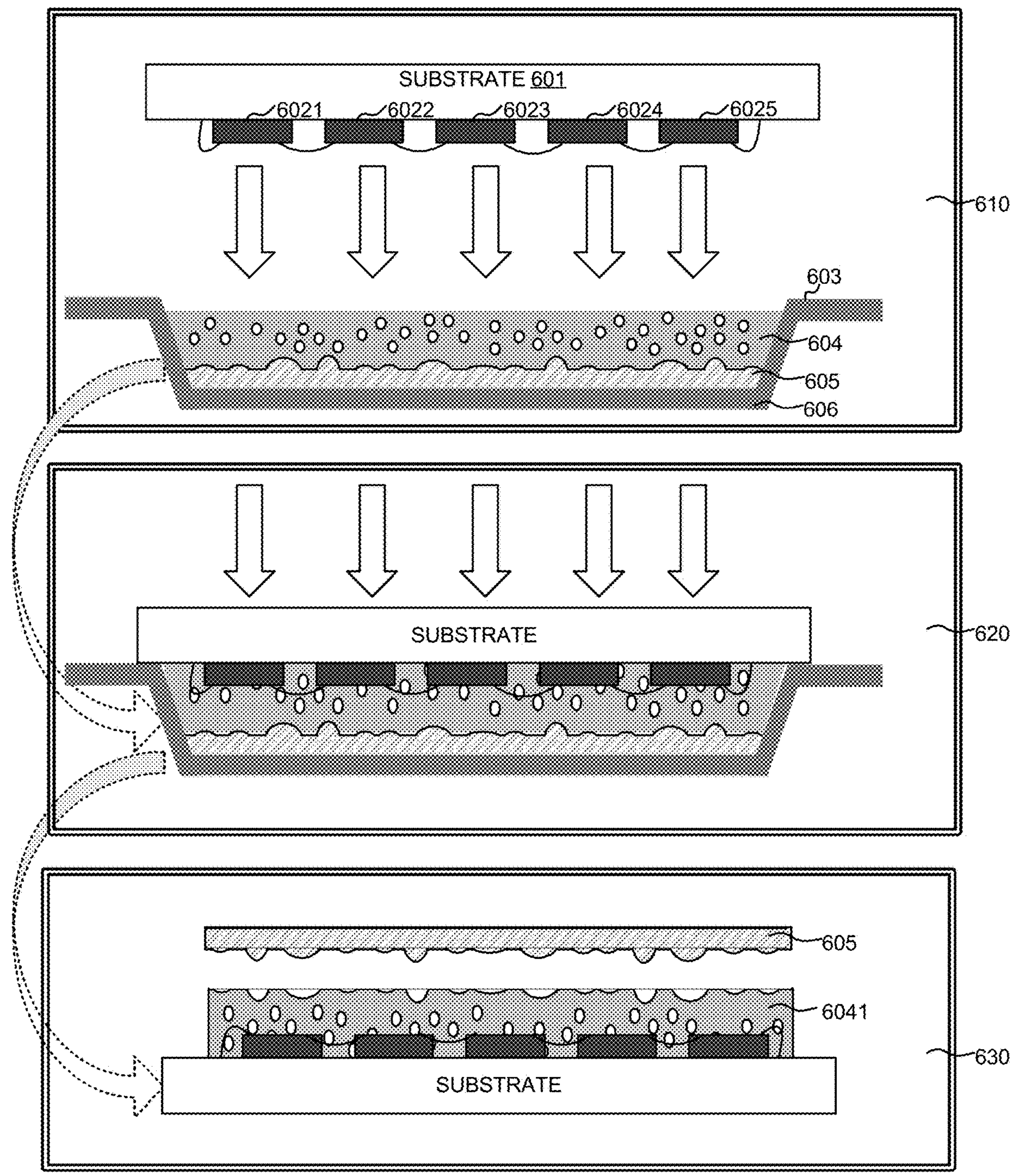
FIG. 6 illustrates an exemplary compression molding process to form the rough top surface using a molding block with periodically arranged microstructures in accordance with embodiments of the current invention.

FIG. 6 illustrates an exemplary compression molding process to form the rough top surface using a molding block with periodically arranged microstructures in accordance with embodiments of the current invention. The compression molding process is used to compression-mold LED chips/dies mounted on a substrate with encapsulating materials. The LEDs are first mounted to the substrate. Silicone scattered with phosphor particles are deposited in the molding cavity. The substrate with the dies mounted is supplied into the compression-molding cavity. LED packages are formed with the completion of the compression molding process. In one novel aspect, the surface of a molding cavity is the modified molding block with a rough surface. In one embodiment, a release film with microstructures is placed on the top surface of the molding cavity forming the modified molding structure. The release film has certain patterns, such as micro lens arrays or randomized microstructures. During the compression molding process, the microstructures are transferred to the top surface of the LED package.

FIG. 6 shows exemplary stages for the compression molding process with stages 610, 620 and 620. At stage 610, arrays of LEDs, such as LEDs 6021, 6022, 6023, 6024, and 6025 are attached to a substrate 601. A compression-molding cavity 603 has a modified molding structure 606. In one embodiment, the surface of modified molding structure 606 is the molding block with a rough surface formed by microstructures. In another embodiment, a release film 605 with a rough surface formed by microstructures is attached to the surface of molding cavity 603. Materials 604 of silicone scattered with phosphor particles are deposited in molding cavity 603. At stage 620, the substrate with attached arrays of LEDs is received by the molding cavity. Heat and pressure are maintained until the silicone is cured. Silicone encapsulating layer scattered with phosphors is formed with the compression molding process. At stage 630, the LED package is removed from the molding cavity. Release film 605 is separated from the LED package. The silicone-encapsulating layer 6041 is formed with rough top surface.

Rough surfaces of LED packages can improve the light extract efficiency. Different methods can be used to form rough surfaces. Unlike sandblasting, compression molding can more easily control the microstructure patterns when forming rough surfaces. Different molding blocks or films can be used to generate different rough surfaces. The microstructures that form the rough surfaces can be randomly arranged or periodically arranged. Different variables can be selected. Measurements of the efficiency of the overall LED package can be tested such that higher efficiency can be obtained.

Figure 7:
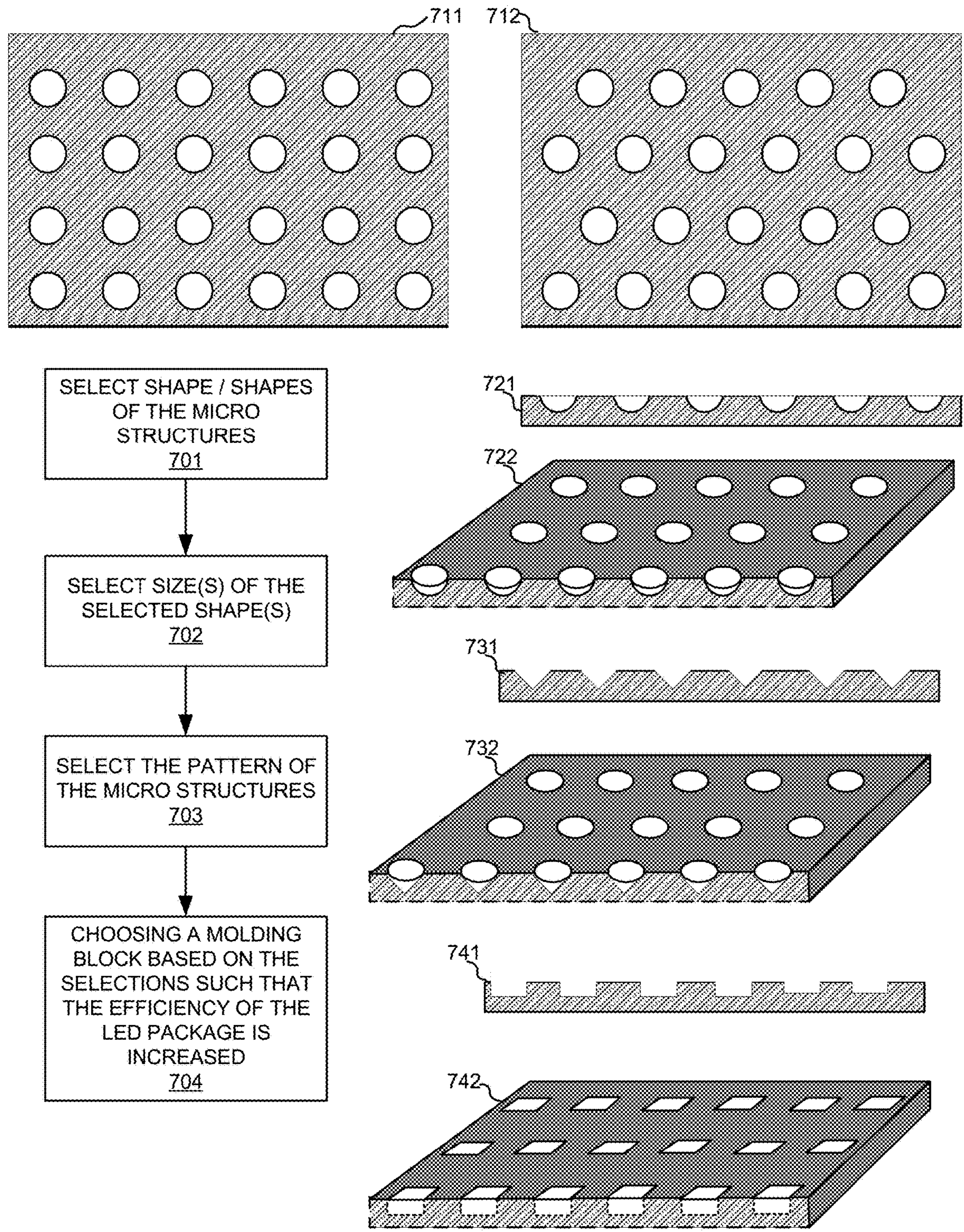
FIG. 7 shows some exemplary microstructure configurations on a molding block for compression molding process to form rough surfaces for LED packages in accordance with embodiments of the current invention.

FIG. 7 shows some exemplary microstructure configurations for a modified molding structure for compression molding process to form rough surfaces for LED packages in accordance with embodiments of the current invention. One of the features of compression molding process is that the microstructures can be periodically arranged with preselected size, shape, and pattern. A sectional view 711 shows a periodically arranged microstructure on a release film or a molding block. Sectional view 711 shows that the microstructures are arranged in lines and columns with equal distances. The distance between each microstructures can be adjusted. It can be evenly distributed as shown in 711, or it can be arranged with variable distances. The size of the microstructures can also be changed. In one embodiment, the size of the microstructure is determined, at least in part, based on the size of the phosphors scattered in the silicone-encapsulating layer. The microstructures can have the same size, as shown in 711, or they can be of different sizes. Microstructures with the same or different sizes can be arranged in a preselected pattern. Sectional view 712 shows a different arrangement for periodically arranged microstructures for a molding block or a release film. The microstructures are arranged in various different patterns. Different microstructure shapes can be used with compression molding method. A side view 721 and a top 722 shows an exemplary configuration where micro lenses are used and arranged periodically. In one embodiment, the micro lenses are of the same size and are placed with equal distance between each other. The diameter of each micro lens is about 2 μm to 20 μm. In one embodiment, the diameter of the micro lens is about 5 μm. Similarly, a side view 731 and a top view of 732 shows an exemplary configuration where cone-shaped microstructures are used. The cone-shaped microstructures are periodically arranged. Other shapes, such as micro pillar and micro dent, can be used. A side view 741 and a top view of 742 shows an exemplary configuration where micro-pillar-shaped microstructures are used. The size/dimension of different microstructures can be adjusted to improve the efficiency.

FIG. 7 also shows an exemplary flow chart of choosing a microstructure arrangement for compression molding. At step 701, one or more shapes are selected for the configuration. The shape can be selected based on one or more parameters such as, performance measurement data, the arrangement of the die, the size of the LED package and other parameters that affect the efficiency of the LED package. At step 702 the size (or sizes) of the selected shape (or shapes) are selected. In one embodiment, the size of the microstructure is at least partly based on the size of the phosphors. The size selection can also be based on other parameters such as performance measurement data, the arrangement of the die, the size of the LED package. At step 703, an arrangement pattern of the selected microstructures is selected. The pattern selection can be based on performance measurement data, the arrangement of the die, the size of the LED package, and other parameters that affect the efficiency of the LED package. It is understood by one of ordinary skills in the art that the above selections can be done in other orders, such as a pattern is selected before the shape is selected and other viable combinations. In other embodiments, the selection can be of a random size within a preselected range, a random shape, or a randomly arranged pattern. Any combination of the parameter selections can be used to form an arrangement of the microstructures. At step 704, a molding block or release film is chosen based on the selections such that the efficiency of the LED package is increased.

Sandblasting is another method that can be used to form rough surfaces for LED packages. In one novel aspect, sandblasting is used to form rough sidewalls for a SMT package. The sandblasting process is implemented after SMT unit separation, which is usually a dicing process followed by a tape expansion process. After the tape expansion, a micro sandblasting process is used. In other embodiments, the sandblasting process can be performed before or after the unit is separated such as a flat type SMT package.

The sandblasting process can also be used to form rough top surface for the LED package. In one novel aspect, the encapsulating layer of the SMT package is scattered with phosphor particles. Therefore, the blasting media needs to be harder than the silicone but softer than phosphor particles such that the blasting media will remove the silicon but will not attack the phosphor. The size of the media can be as small as a few microns to as large one hundred microns. The media material can be glass beads or other abrasive media. The blasting process can be performed by an automatic sandblasting machine. Using the sandblasting process, the rough surface is normally formed by randomly arranged microstructures. Other than the size and hardness of the blasting media, other parameters can be considered for the sandblasting process. In one embodiment, the sandblasting base, on which the LED package is attached, can be tilted to a selected angle. In another embodiment, the blasting media is blasting at a tilted angle.

Figure 8:
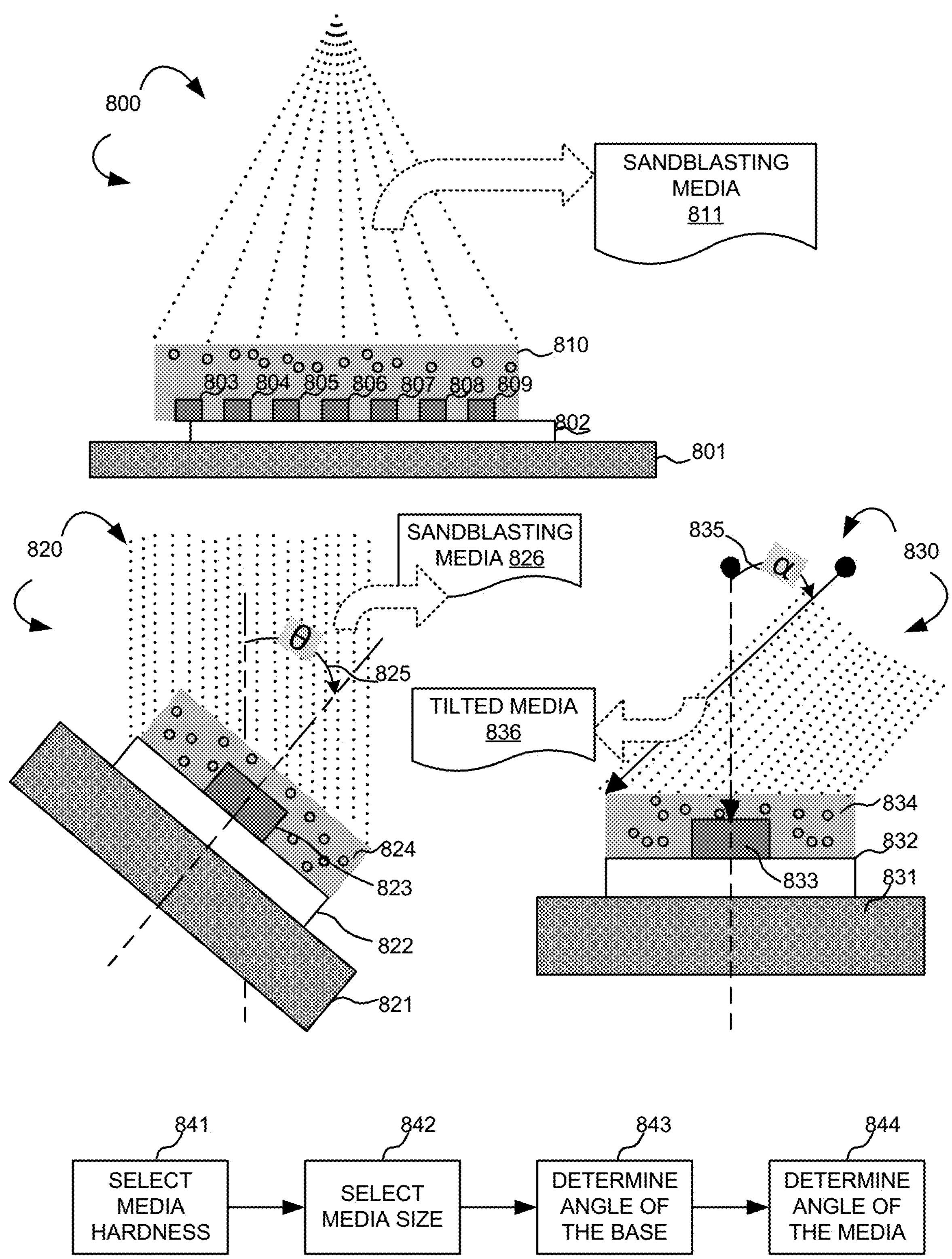
FIG. 8 shows an exemplary sandblasting process that forms rough surfaces for the LED package in accordance with embodiments of the current invention.

FIG. 8 shows an exemplary sandblasting process that forms rough surfaces for the LED package in accordance with embodiments of the current invention. A sandblasting system 800 has a base 801. A LED package with a substrate 802, multiple LEDs, such as 803 to 809 and a phosphor scattered silicone-encapsulating layer 810. The LED package is attached to sandblasting base 801, which is inside the sandblast chamber. A sandblasting machine blasts blasting media 811 to the sandblast chamber. The size of the blasting media is about 2 μm to 100 μm. The blasting media is harder than the silicone but softer than the phosphor.

FIG. 8 further shows a sandblasting system 820. Sandblasting system 820 has a base 821. A LED package with a substrate 822, a LED 823, and a phosphor scattered silicone encapsulating layer 824. The LED package is attached to base 821. Blasting media 826 travels vertically. In one embodiment, base 821, together with the LED package is tilted to an angel 825 equals to θ. With the tilted base, sidewalls/side surfaces of the LED package are roughened with microstructures.

FIG. 8 also shows a sandblasting system 830. Sandblasting system 820 has a sandblasting base 831. A LED package with a substrate 832, a LED 833, and a phosphor scattered silicone encapsulating layer 834. The LED package is attached to sandblasting base 821. Sandblasting media 836 blasts down towards the LED package at a tilted angle 836 equals to α.

Compared with compression molding process, it is harder to control the configuration of the microstructures that form the rough surfaces. However, different parameters can be chosen. Measurements can be done with selected parameters such that efficiency of the LED package is correlated with the parameters chosen. FIG. 8 further illustrates an exemplary flow chart for selecting the parameters. At step 841, the blasting media is selected based on hardness of the media. The media hardness has to be harder than the silicone and softer than the phosphor. At step 842, the size or a range of the size is selected for the blasting media based on a size-selection criterion. The size of blasting material is about 2 μm to 100 μm. At step 843, the angle of the base is selected. The angle can be zero when the base is not tilted. At step 844, the blasting angle of blasting media a is selected based on a angle-selection criterion such that the efficiency of the LED package is improved. The size-selection criterion and angle-selection criterion can be based on measurement data, the size of the LED package, the arrangement of the LEDs and other relevant parameters. It is understood by one of ordinary skills in the art that the above selections can be done in other orders. For example, the media size is selected before the hardness is selected.

Figure 9:
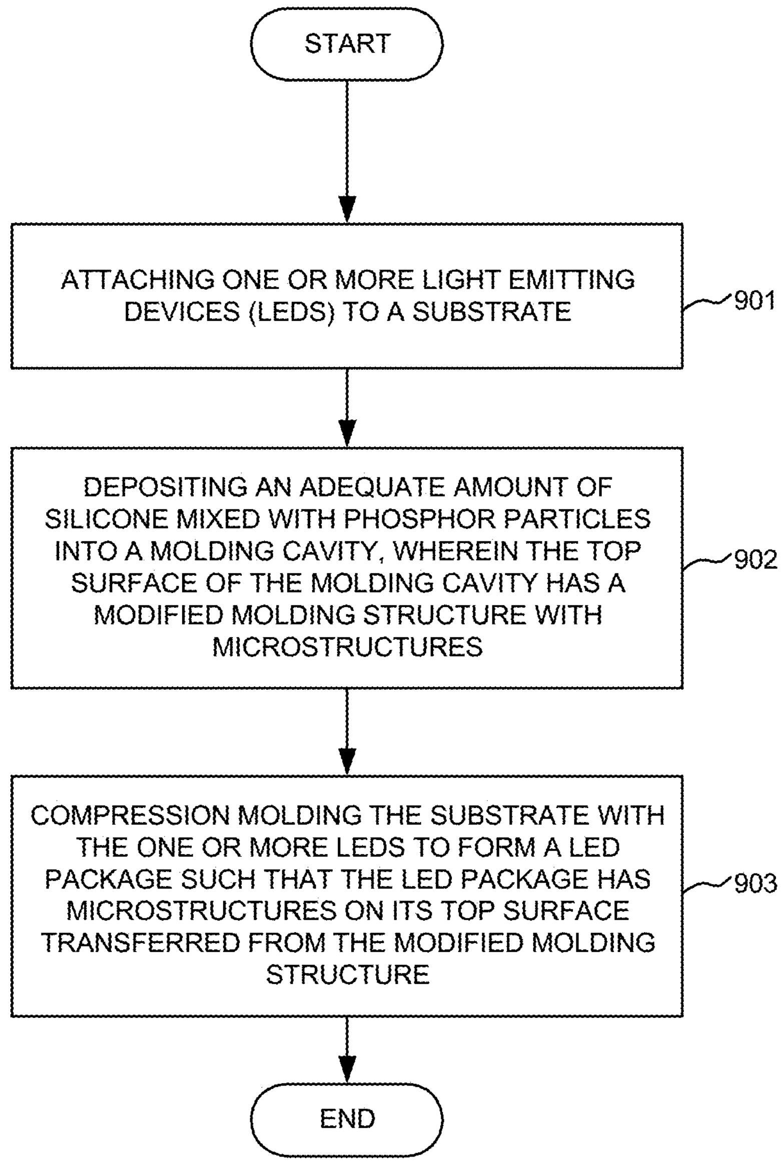
FIG. 9 shows an exemplary flow chart of using the compression molding process to form rough surfaces for a LED package in accordance with embodiments of the current invention.

FIG. 9 shows an exemplary flow chart of using the compression molding process to form rough surfaces for a LED package in accordance with embodiments of the current invention. Step 901 attaches one or more LEDs to a substrate. Step 902 deposits an adequate amount of silicone mixed with phosphor particles into a molding cavity, wherein the top surface of the molding cavity has a modified molding structure with microstructures. Step 903 compression molds the substrate with the one or more LEDs to form a LED package such that the LED package has microstructures on its top surface transferred from the modified molding structure.

Figure 10:
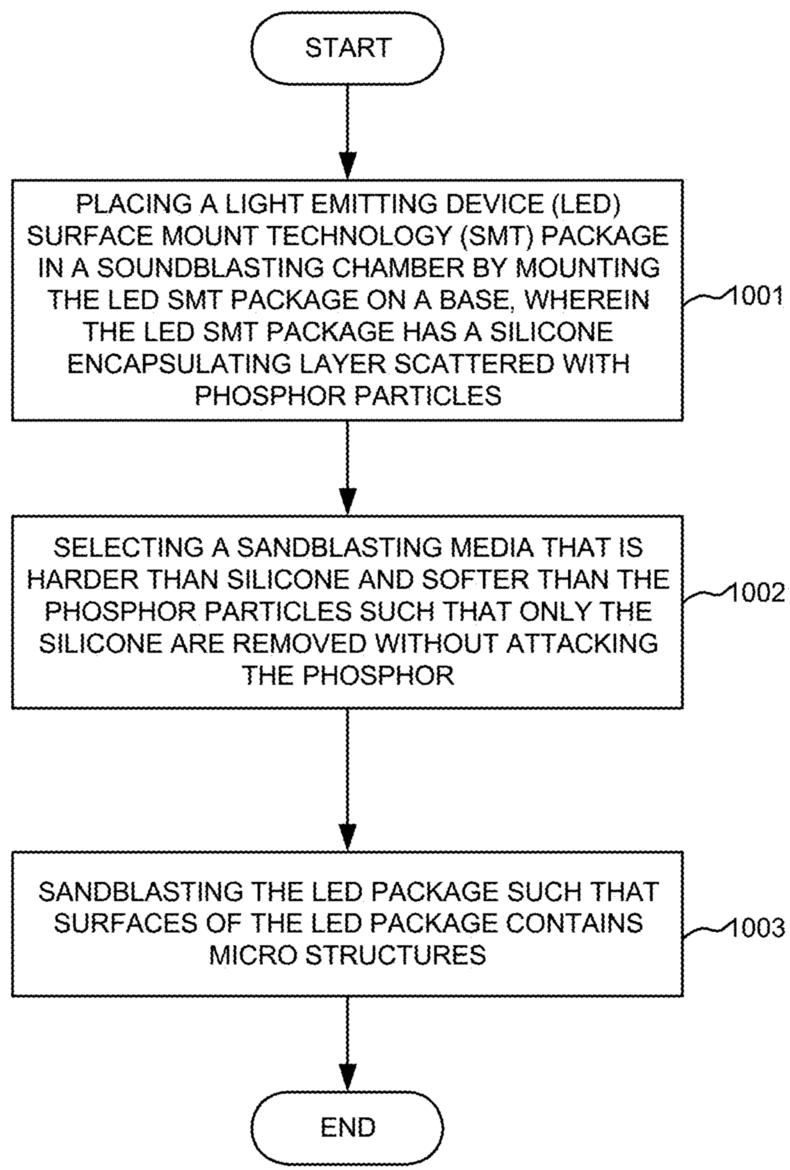
FIG. 10 shows an exemplary flow chart of using the sandblasting process to form rough surfaces for a LED package in accordance with embodiments of the current invention.

FIG. 10 shows an exemplary flow chart of using the sandblasting process to form rough surfaces for a LED package in accordance with embodiments of the current invention. Step 1001 places a LED SMT package in a soundblasting chamber by mounting the LED SMT package on a base, wherein the LED SMT package has a silicone encapsulating layer scattered with phosphor particles. Step 1002 selects a sandblasting media that is harder than silicone and softer than the phosphor particles such that only the silicone are removed without attacking the phosphor. Step 1003 sandblasts the LED package such that surfaces of the LED package contains microstructures.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A light emitting devices (LED) package, comprising:

a leadframe substrate having a top surface;

one or more LEDs attaching to the top surface of the leadframe substrate;

a silicone encapsulating layer covering the LEDs and a substantial area of the leadframe substrate, wherein the silicone encapsulating layer is scattered with phosphor particles;

microstructures on a top surface of the silicone-encapsulating layer periodically arranged with a pattern that is selected to increase an efficiency of the LED package, wherein the microstructures on the top surface are micro lens with diameters about 2 μm to 20 μm; and microstructures on side surfaces of the silicone-encapsulating layer.

2. The LED package of claim 1, wherein the silicone-encapsulating layer is cube shaped.

3. The LED package of claim 1, comprising a plurality of LEDs attaching to the top surface of the leadframe substrate.

* * * * *